United States Patent
Kim et al.

(10) Patent No.: US 8,139,331 B2
(45) Date of Patent: Mar. 20, 2012

(54) ELECTROSTATIC DISCHARGE PROTECTION CIRCUIT

(75) Inventors: Sang-Kyung Kim, Chungcheongbuk-do (KR); Tae-Kyoung Kang, Chungcheongbuk-do (KR); Hyoung-Kyu Kim, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 487 days.

(21) Appl. No.: 12/500,258

(22) Filed: Jul. 9, 2009

(65) Prior Publication Data
US 2010/0157494 A1   Jun. 24, 2010

(30) Foreign Application Priority Data
Dec. 24, 2008  (KR) .............................. 2008-0133879

(51) Int. Cl.
*H02H 9/00*  (2006.01)
(52) U.S. Cl. ........................................................ 361/56
(58) Field of Classification Search ..................... 361/56
See application file for complete search history.

(56) References Cited

U.S. PATENT DOCUMENTS

| | | | |
|---|---|---|---|
| 6,236,248 B1 * | 5/2001 | Koga | 327/112 |
| 7,652,466 B2 * | 1/2010 | Kimura | 324/123 R |
| 2007/0284666 A1 | 12/2007 | Duvvury et al. | |

* cited by examiner

*Primary Examiner* — Stephen W Jackson
(74) *Attorney, Agent, or Firm* — Morgan, Lewis & Bockius LLP

(57) ABSTRACT

A ESD protection circuit includes: a first clamp connected between a first power line and a ground line; a second clamp connected between the ground line and a second power line; a first output buffer connected between the first power line and the ground line, and providing a first operating voltage; a second output buffer connected between the ground line and the second power line, and providing a second operating voltage; a first switch unit configured to transfer the first operating voltage to an I/O pad; a second switch unit configured to transfer the second operating voltage to the I/O pad; a first transfer unit comprising one or more diodes connected in series between the first power line and the I/O pad; and a second transfer unit comprising one or more diodes connected in series between the I/O pad and the second power line.

12 Claims, 7 Drawing Sheets

ELECTROSTATIC DISCHARGE PROTECTION CIRCUIT

CROSS-REFERENCE TO RELATED APPLICATIONS

The present invention claims priority of Korean Patent Application No. 10-2008-0133879, filed on Dec. 24, 2008 which is incorporated herein by reference.

BACKGROUND OF THE INVENTION

1. Field of the Invention

The present invention relates to an electrostatic discharge (ESD) protection circuit, and more particularly, to an ESD protection circuit in a drive integrated circuit (IC) chip of a display supporting a dot inversion scheme.

2. Description of Related Art

In general, electrostatic discharge (ESD) protection circuits are provided between pads, referred to as 'input/output pads' hereafter, to which internal circuits of a semiconductor device and external input/output pins are connected, to prevent products from being broken down and deteriorated due to static electricity.

When a semiconductor device contacts a charged human body or a charged apparatus, static electricity charged in the human body or apparatus is discharged into an internal circuit of the semiconductor device through external pins via input/output pads so that a transient current with great energy flows into the internal circuit, thus causing severe damage to the semiconductor device. In addition, when a charged semiconductor device contacts an apparatus, the static electricity charged in the internal circuit of the semiconductor device may be discharged to the outside through the apparatus. This also may result in a transient current flowing into the internal circuit, which causes damage to the semiconductor device.

Accordingly, in most semiconductor integrated circuits, the ESD protection circuits are provided between the input/output pads and internal circuits of semiconductor devices in order to prevent the damage caused by the ESD.

FIG. 1 is a circuit diagram illustrating the ESD circuit that is provided to an output terminal of a source driver in a drive IC chip of a liquid crystal display.

Referring to FIG. 1, the typical ESD protection circuit has too small area to integrate clamp circuits that can withstand the electrostatic stress in each pad. Consequently, a current is generally discharged through diodes MPD and MND, as shown in FIG. 1. Most output voltages of a source driver have voltage levels between a ground voltage (i.e., 0 V) and a predetermined positive operating voltage. Accordingly, a circuit for driving the source driver is implemented with components having a positive operating voltage, and therefore the ESD protection circuit is also optimized to the operating voltage.

To be specific, the typical ESD protection circuit includes an input/output pad I/O, an output buffer 106, a transfer unit 108, and a clamp 110. The output buffer 106 transfers a source voltage to the input/output pad I/O. The transfer unit 108 transfers the static electricity inputted through the input/output pad I/O to various paths, thereby protecting internal circuits. The clamp 110 maintains a voltage difference between a power line 102 and a ground line 104 to a constant level. The typical ESD protection circuit further includes a switch unit 112 and a resistor 114 for transferring a signal transferred to the output buffer 106 to the input/output pad I/O.

The transfer unit 108 includes first and second diodes MPD and MND serially connected to each other in a forward direction. The first diode MPD is connected between the power line 102 and the input/output pad I/O. The second diode MND is connected between the input/output pad I/O and the ground line 104. A cathode terminal of the first diode MPD is connected to the power line 102, and an anode terminal of the first diode MPD is connected to the input/output pad I/O. A cathode terminal of the second diode MND is connected to the input/output pad I/O and an anode terminal of the second diode MND is connected to the ground line 104.

In a normal mode, the typical ESD protection circuit having the above-described configuration does not affect the circuit operation since both of the first and second diodes MPD and MND of the transfer unit 108 are reverse-biased and thus are turned off. However, when the static electricity is generated between the input/output pad I/O and a power supply voltage (VPP) pad or a ground voltage (VSS) pad, one of the first and second diodes MPD and MND operates to form an ESD path. As a result, the internal circuit can be prevented from being broken down by the static electricity flowing thereinto.

The above-described typical ESD protection circuit may be applied to a liquid crystal display having an operating voltage level ranging from a ground voltage level to a positive voltage level in a frame or line inversion scheme. However, unlike the frame or line inversion scheme, a liquid crystal display supporting a dot inversion scheme requires an operating voltage level ranging from a negative voltage level to a positive voltage level. That is, in the dot inversion scheme, the operating voltage should not only be in a ground-to-positive voltage range, but also in a negative-to-ground voltage range.

Thus, the typical ESD protection circuit of FIG. 1 cannot be applied to the liquid crystal display supporting a dot inversion scheme.

SUMMARY OF THE INVENTION

An embodiment of the present invention is directed to an electrostatic discharge (ESD) protection circuit that is applicable to a source driver of a drive integrated circuit (IC) chip in a liquid crystal display supporting a dot inversion scheme.

In accordance with an aspect of the present invention, there is provided an electrostatic discharge (ESD) protection circuit including a first clamp connected between a first power line and a ground line; a second clamp connected between the ground line and a second power line; a first output buffer connected between the first power line and the ground line, and providing a first operating voltage to an input/output pad; a second output buffer connected between the ground line and the second power line, and providing a second operating voltage to the input/output pad; a first switch unit configured to transfer the first operating voltage to the input/output pad; a second switch unit configured to transfer the second operating voltage to the input/output pad; a first transfer unit comprising one or more diodes having a breakdown voltage higher than the first operating voltage and connected in series between the first power line and the input/output pad; and second transfer unit comprising one or more diodes having a breakdown voltage higher than the second operating voltage and connected in series between the input/output pad and the second power line.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

Figure 1:
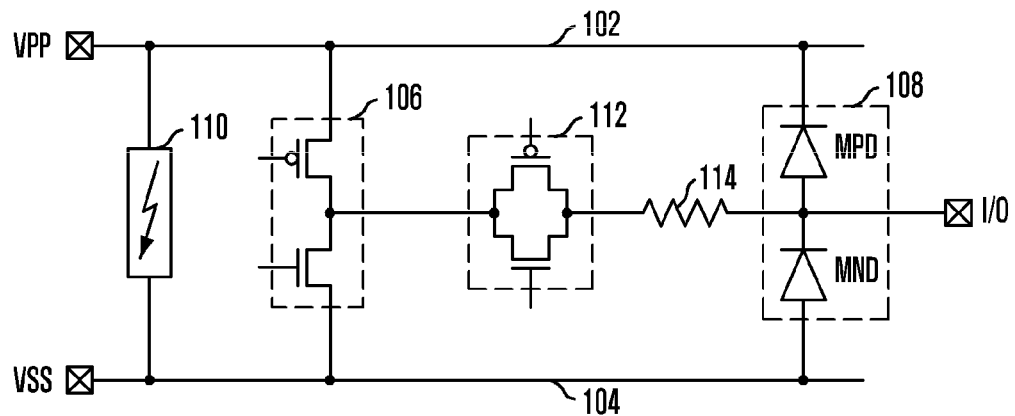
FIG. 1 is a circuit diagram of a typical electrostatic discharge (ESD) protection circuit.

Hereafter, preferred embodiments of the present invention will be described in detail with reference to the accompanying drawings in such a manner that the technical idea of the present invention may easily be carried out by a person of ordinary skill in the art to which the invention pertains. In addition, like reference numerals or symbols refer to like elements throughout.

In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). Furthermore, when it is described that one comprises (or includes or has) some elements, it should be understood that it may comprise (or include or has) only those elements, or it may comprise (or include or have) other elements as well as those elements if there is no specific limitation.

First Embodiment

Figure 2:
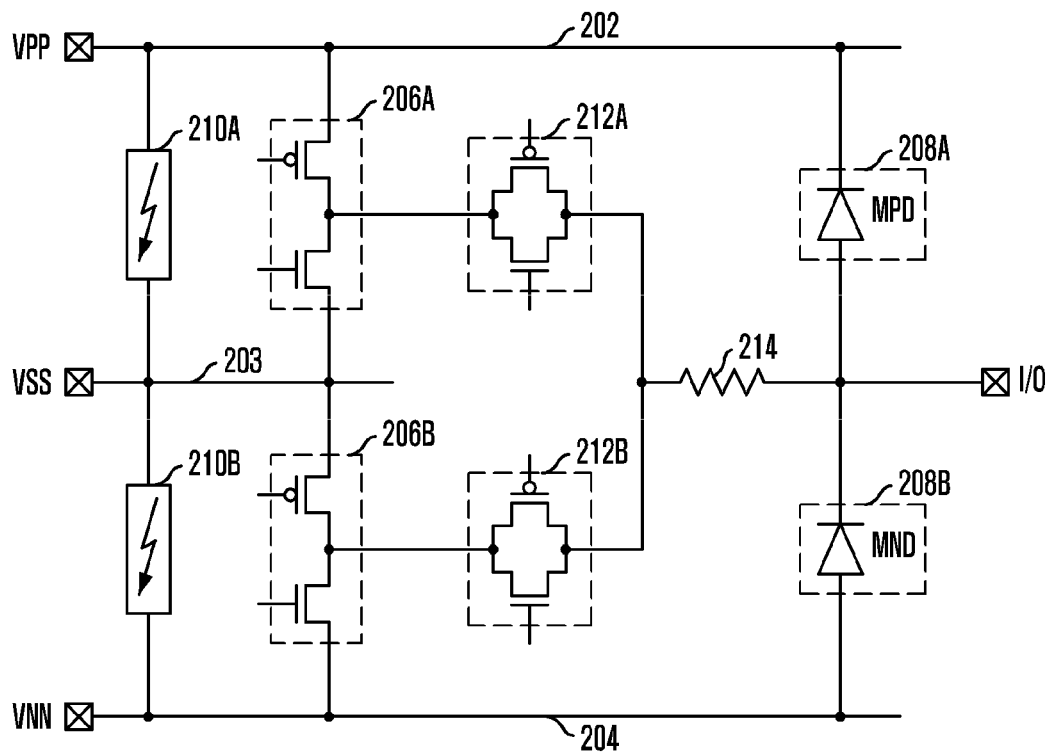
FIG. 2 is a circuit diagram of an ESD protection circuit in accordance with a first embodiment of the present invention.

FIG. 2 is a circuit diagram of an electrostatic discharge (ESD) protection circuit in accordance with a first embodiment of the present invention.

Referring to FIG. 2, unlike typical ESD protection circuit of FIG. 1, the ESD protection circuit in accordance with the first embodiment of the present invention includes two output buffers so as to support a dot inversion. A first output buffer 206A is connected between a positive power line, referred to as a 'first power line' hereafter, 202 and a ground line 203 to thereby output a voltage ranging between a positive power supply voltage VPP, referred to as a 'first power supply voltage' hereafter, and a ground voltage VSS. A second output buffer 206B is connected between the ground line 203 and a negative power line, referred to as a 'second power line' hereafter, 204 to thereby output a voltage ranging between a negative power supply voltage VNN, referred to as a 'second power supply voltage' hereafter, and the ground voltage VSS.

Furthermore, the ESD protection circuit in accordance with the first embodiment of the present invention includes two clamps according to the first and second output buffers 206A and 206B. The first clamp 210A is connected between the first power line 202 and the ground line 203, and maintains a voltage between the first power line 202 and the ground line 203 to a predetermined level. The second clamp 210B is connected between the ground line 203 and the second power line 204, and maintains a voltage between the ground line 203 and the second power line 204 to a predetermined level.

The ESD protection circuit in accordance with the first embodiment of the present invention further includes two transfer units which are first and second transfer units 208A and 208B. The first transfer unit 208A is implemented with a first diode MPD, and the second transfer unit 208B is implemented with a second diode MND. The first transfer unit 208A is connected between the first power line 202 and an input/output pad I/O. The second transfer unit 208B is connected between the input/output pad I/O and the second power line 204.

The first diode MPD of the first transfer unit 208A and the second diode MND of the second transfer unit 208B are connected to each other in a forward direction. The first diode MPD differs in conductivity type which is a p-type or an n-type from the second diode MND based on each type well. For example, the first diode MPD has an n-type well, and the second diode MND has a p-type well. The first and second diodes MPD and MND have the same breakdown voltage. Herein, the breakdown voltage means the maximum tolerable voltage that the diode is not broken down when a reverse voltage is applied across the first and second diodes MPD and MND.

In addition, the first diode MPD has a breakdown voltage higher than a first operating voltage of the first output buffer 206A, and the second diode MND has a breakdown voltage higher than a second operating voltage of the second output buffer 206B. Herein, the first and second operating voltages indicate voltages that are applied to an internal circuit through the input/output pad I/O which means the voltages operate elements included in the source driver to operate.

The ESD protection circuit in accordance with the first embodiment of the present invention further includes a first switch unit 212A and a second switch unit 212B. The first switch unit 212A transfers the first operating voltage outputted from the first output buffer 206A to the input/output pad I/O, and the second switch unit 212B transfers the second operating voltage outputted from the second output buffer 206B to the input/output pad I/O. Each of the first and second switch units 212A and 212B is implemented with a transfer gate in which PMOS and NMOS transistors are connected in parallel.

The ESD protection circuit in accordance with the first embodiment of the present invention in FIG. 2 can be applied to a source driver of a drive integrated circuit chip in a liquid crystal display supporting a dot inversion scheme.

For example, assuming that the first power supply voltage VPP is 5V, the ground voltage VSS is 0 V, and the second power supply voltage VNN is −5 V, the first output buffer 206A outputs the first operating voltage having a voltage level ranging from 0 V to 5 V, and the second output buffer 206B outputs the second operating voltage having a voltage level ranging from −5 V to 0 V.

Accordingly, the operating voltage outputted through the input/output pad I/O has the voltage level ranging from −5 V to 5 V, and therefore the first and second switch units 212A and 212B employs a high voltage switch of approximately 30

V. Such a high voltage switch is the same as a component used to drive a gate in a one-chip drive IC chip.

Second Embodiment

Figure 3:
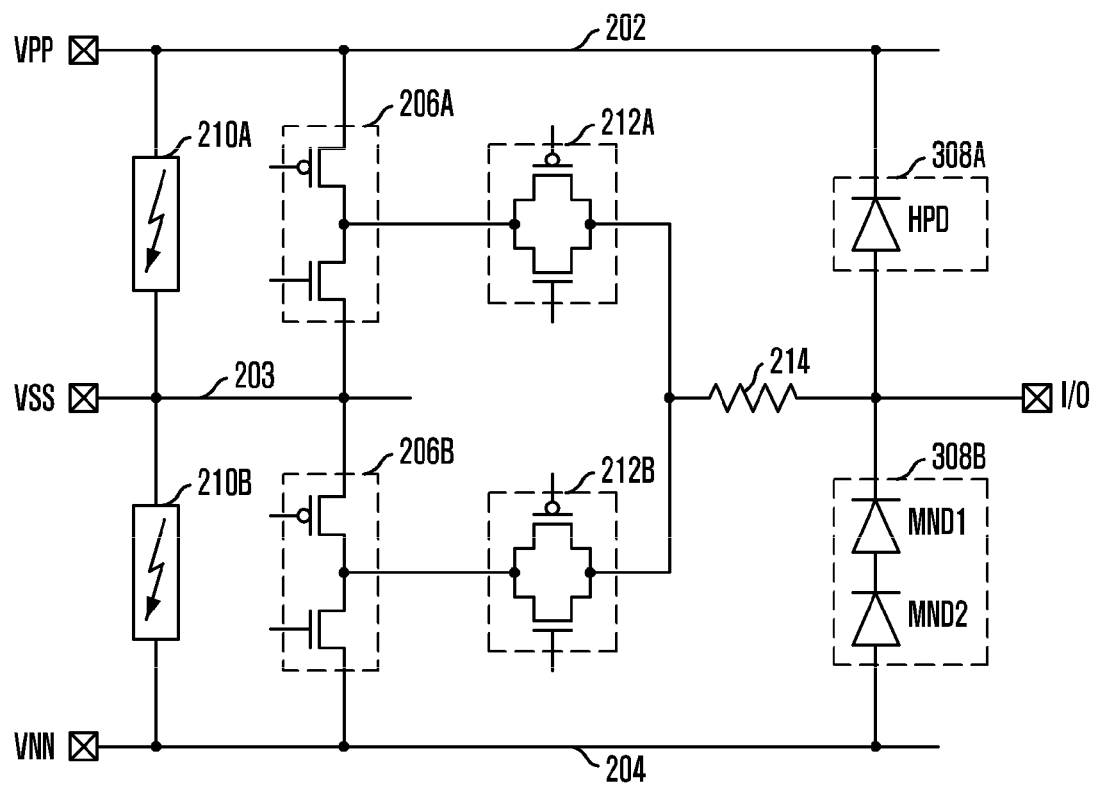
FIG. 3 is a circuit diagram of an ESD protection circuit in accordance with a second embodiment of the present invention.

FIG. 3 is a circuit diagram illustrating an ESD protection circuit in accordance with a second embodiment of the present invention.

Referring to FIG. 3, the ESD protection circuit in accordance with the second embodiment of the present invention is similar in configuration to the ESD protection circuit in accordance with the first embodiment in FIG. 2. However, there is a great difference in first and second transfer units 308A and 308B.

Description will be made on operating characteristics of the ESD protection circuit in accordance with the first embodiment in FIG. 2.

In positive discharge of a ground voltage (VSS) mode, a discharge path is formed through the first power line 202. At this time, a reverse voltage VRMND applied to the second diode MND is expressed as Equation 1 below.

$$VRMND = VMPD + 2VC \qquad \text{Eq. 1}$$

where VMPD represents a forward voltage of the first diode MPD, and VC represents a clamp voltage.

As seen from Equation 1, the reverse voltage VRMND of the second diode MND may exceed a breakdown voltage of the second diode MND by the forward voltage VMPD of the first diode MPD and the clamp voltage VC.

In negative discharge of a first power supply voltage (VPP) mode, a discharge path is formed through the second power line 204. At this time, the reverse voltage VRMPD applied to the first diode MPD is expressed as Equation 2 below.

$$VRMPD = VMND + 2VC \qquad \text{Eq. 2}$$

where VMND represents a forward voltage of the second diode MND, and VC represents a clamp voltage.

As seen from Equation 2, the reverse voltage VRMPD of the first diode MPD may exceed a breakdown voltage of the first diode MPD by the forward voltage VMND of the first diode MPD and the clamp voltage VC.

Even in case of a charge device model (CDM) discharge that is not related with the first power supply voltage (VPP) mode or the ground voltage (VSS) mode, the discharge may occur through the same path.

When the ESD protection circuit in accordance with the first embodiment of the present invention is applied to a drive IC chip supporting a dot inversion scheme, the diode of the ESD protection circuit may be broken down. To prevent the breakdown of the diode, the breakdown voltages of the diodes MPD and MND of the first and second transfer units 208A and 208B should be increased.

Therefore, in the ESD protection circuit in accordance with the second embodiment of the present invention as illustrated in FIG. 3, the first transfer unit 308A is implemented with one high voltage diode HPD having a high breakdown voltage, and the second transfer unit 308B is implemented with two medium voltage diodes MND1 and MND2 having medium breakdown voltages which are connected to each other in series. This configuration of the first and second transfer units 308A and 308B allows the high voltage diode HPD to withstand the reverse voltage VRMPD expressed in Equation 2, and the medium voltage diodes MND1 and MND2 to withstand the reverse voltage VRMND expressed in Equation 1.

Figure 7:
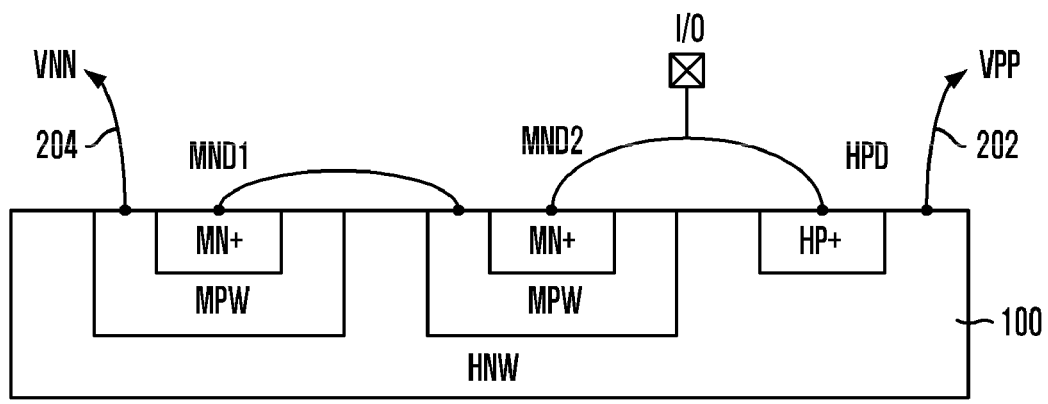
FIG. 7 is a cross-sectional view illustrating first and second transfer units shown in FIG. 3.

FIG. 7 is a cross-sectional view illustrating the first and second transfer units 308A and 308B shown in FIG. 3.

Referring to FIG. 7, the high voltage diode HPD of the first transfer unit 308A in FIG. 3 includes a high-voltage n-well HNW formed in a semiconductor substrate 100, and a high-voltage p-doped region HP+ formed in the high-voltage n-well HNW. The high-voltage p-doped region HP+ forming the high voltage diode HPD is connected to the input/output pad I/O, and the high-voltage n-well HNW is commonly connected to the first power line 202 through which the first power supply voltage VPP is applied.

Each of the medium diodes MND1 and MND2 of the second transfer unit 308B includes a medium-voltage p-well MPW formed in the high-voltage n-well HNW, and a medium-voltage n-doped region MN+ formed in the medium-voltage p-well MPW. The medium-voltage p-well MPW of the medium voltage diode MND1 is connected to the second power line 204 through which the second power supply voltage VNN is applied. The medium-voltage n-doped region MN+ of the medium voltage diode MND1 is connected to the medium-voltage p-well MPW of the medium voltage diode MND2. The medium-voltage n-doped region MN+ of the medium voltage diode MND2 is connected to the high-voltage p-doped region HP+ of the high voltage diode HPD.

As illustrated in FIG. 7, in the high voltage diode HPD of the first transfer unit 308A, the high-voltage n-well HNW is commonly connected to the first power line 202 through which the first power supply voltage VPP is applied. Accordingly, it is possible to form the high voltage diode HPD in a narrow channel region as far as a distance between the medium-voltage p-well MPW of the medium voltage diode MND2 and the high-voltage p-doped region HP+ of the high voltage diode HPD is maintained. In the medium-voltage diodes MND1 and MND2, it is also possible to form the two medium-voltage diodes MND1 and MND2 in a narrow channel region as far as a distance between the medium-voltage p-wells MPW of the two medium-voltage diodes MND1 and MND2 is maintained.

Third Embodiment

Figure 4:
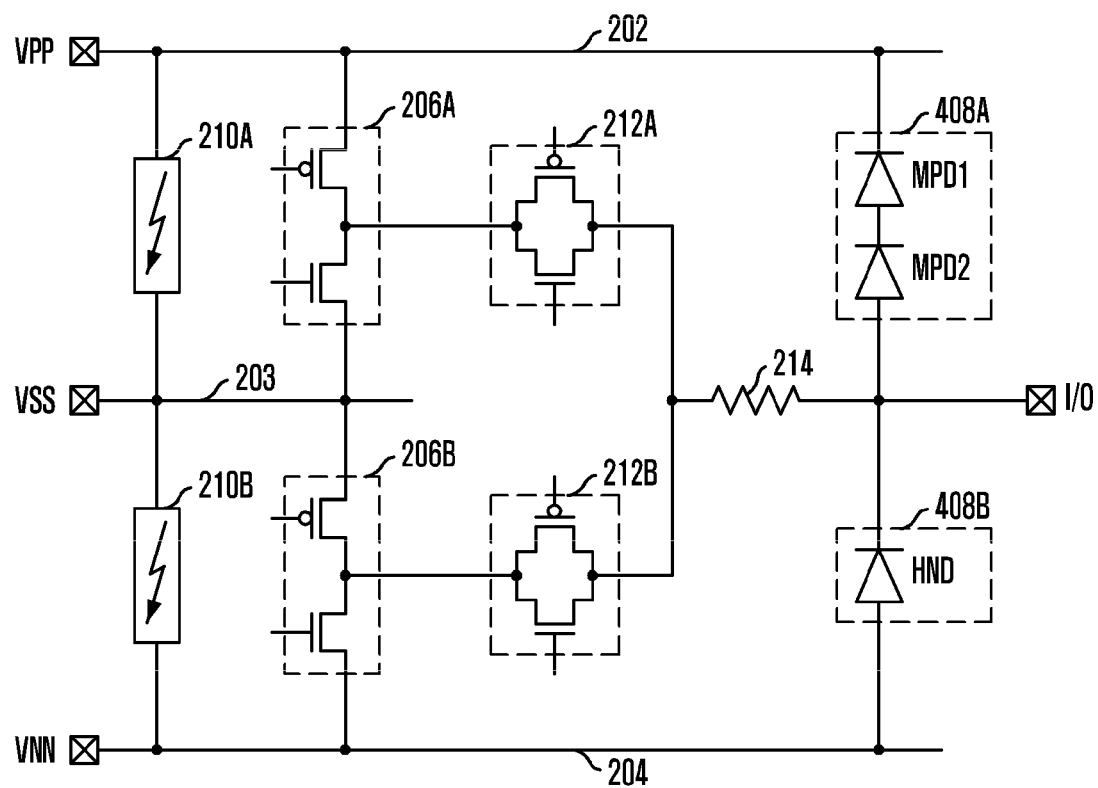
FIG. 4 is a circuit diagram of an ESD protection circuit in accordance with a third embodiment of the present invention.
Figure 8:
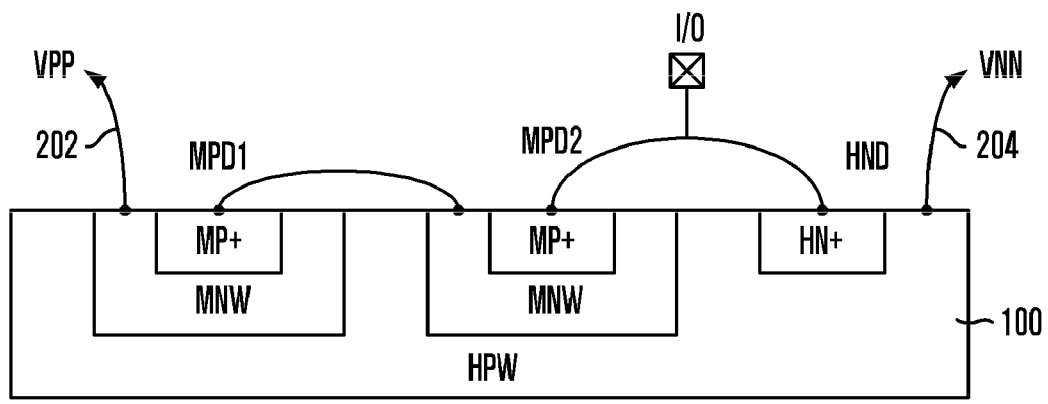
FIG. 8 is a cross-sectional view illustrating first and second transfer units shown in FIG. 4.

FIG. 4 is a circuit diagram of an ESD protection circuit in accordance with a third embodiment of the present invention. FIG. 8 is a cross-sectional view illustrating first and second transfer units 408A and 408B shown in FIG. 4.

Referring to FIG. 4, in the ESD protection circuit in accordance with the third embodiment of the present invention, the first transfer unit 408A is implemented with two medium diodes MPD1 and MPD2, and the second transfer unit 408B is implemented with one high voltage diode MND, which significantly differs from the ESD protection circuit of FIG. 3. The ESD protection circuit in FIG. 4 has the same configuration as that in FIG. 3 except for the first and second transfer units 408A and 408B.

As illustrated in FIG. 8, the ESD protection circuit in accordance with the third embodiment employs a high-voltage p-well HPW, which differs from the second embodiment of FIG. 7. The high-voltage p-well HPW is connected to the second power line 204 through which the second power supply voltage VNN is applied. Medium-voltage n-wells MNW are formed in the high-voltage p-well HPW to form middle-voltage diodes MPD1 and MPD2 of the first transfer unit 408A.

Likewise, to form the high voltage diode HND of the second transfer unit 408B, a high-voltage n-doped region HN+ is formed in the high-voltage p-well HPW. The high voltage diode HND of the second transfer unit 408B has a breakdown voltage higher than a second operating voltage of the second output buffer 206B.

Each of the medium diodes MPD1 and MPD2 of the first transfer unit 408A has a breakdown voltage that is equal to or higher than the first operating voltage of the first output buffer 206A. Of course, the high voltage diode HND has a higher breakdown voltage than the medium voltage diodes MPD1 and MPD2. For example, when a source operating voltage swings from −5 V to 5 V, the high voltage diode HND has the breakdown voltage of 30 V, and each of the medium voltage diodes MPD1 and MPD2 has the breakdown voltage of 5 V.

Fourth Embodiment

Figure 5:
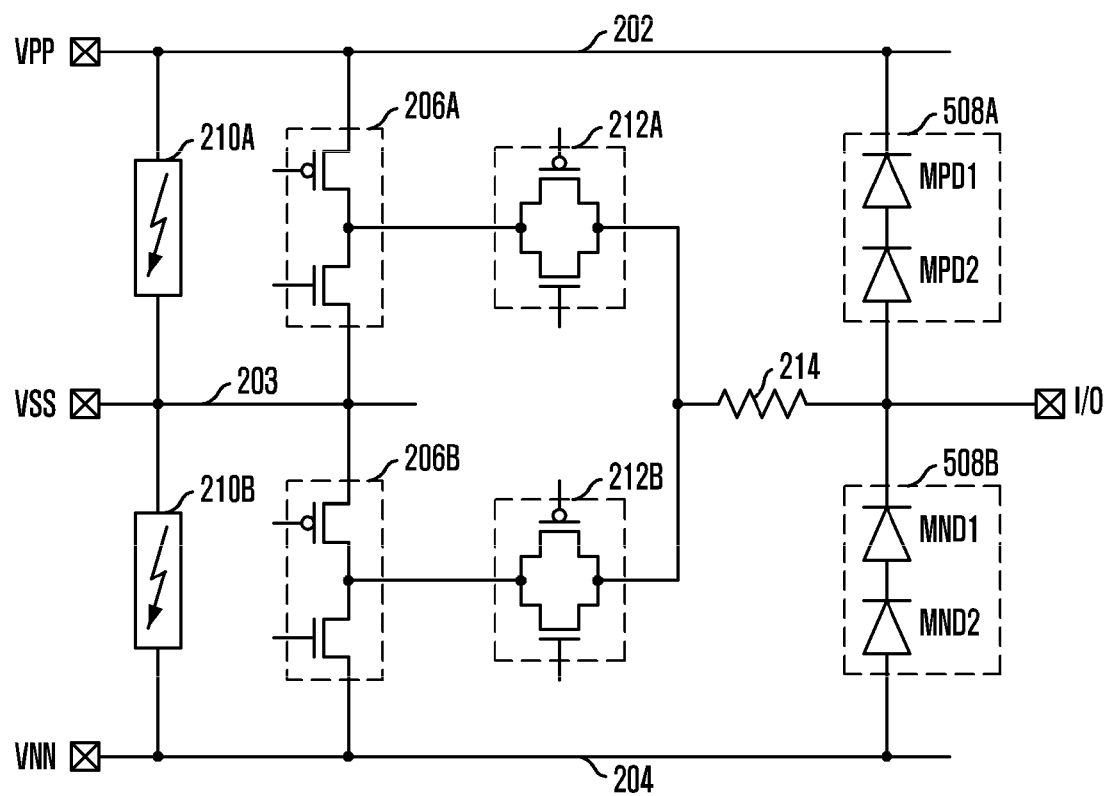
FIG. 5 is a circuit diagram of an ESD protection circuit in accordance with a fourth embodiment of the present invention.
Figure 9:
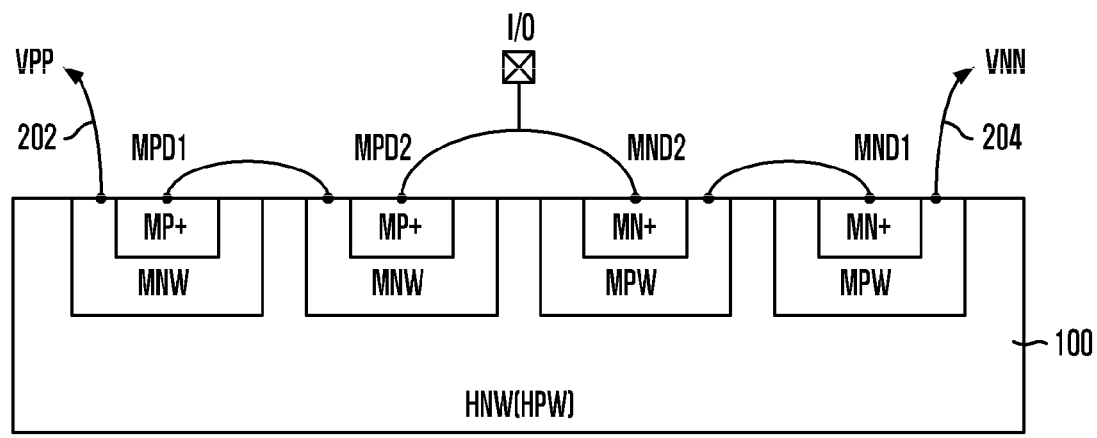
FIG. 9 is a cross-sectional view illustrating first and second transfer units shown in FIG. 5.

FIG. 5 is a circuit diagram of an ESD protection circuit in accordance with a fourth embodiment of the present invention. FIG. 9 is a cross-sectional view illustrating first and second transfer units 508A and 508B shown in FIG. 5.

Referring to FIG. 5, in the ESD protection circuit in accordance with the fourth embodiment of the present invention, each of the first and second transfer units 508A and 508B is implemented with two medium diodes. To be specific, the first transfer unit 508A is configured with two medium diodes MPD1 and MPD2, and the second transfer unit 508B is configured with two medium diodes MND1 and MND2.

In the ESP protection circuit in accordance with the fourth embodiment of FIG. 9, medium-voltage n-wells MNW and medium-voltage p-wells MPW are formed in a high-voltage n-well HNW or a high-voltage p-well HPW, a medium voltage p-doped region MP+ is formed in the medium-voltage n-well MNW, and a medium-voltage n-doped region MN+ is formed in the medium-voltage p-well MPW. The medium-voltage n-well MNW of the medium voltage diode MPD1 is connected to the first power line 202 through which the first power supply voltage VPP is applied. The medium-voltage p-well MPW of the medium voltage diode MND1 is connected to the second power line 204 through which the second power supply voltage VNN is applied.

Fifth Embodiment

Figure 6:
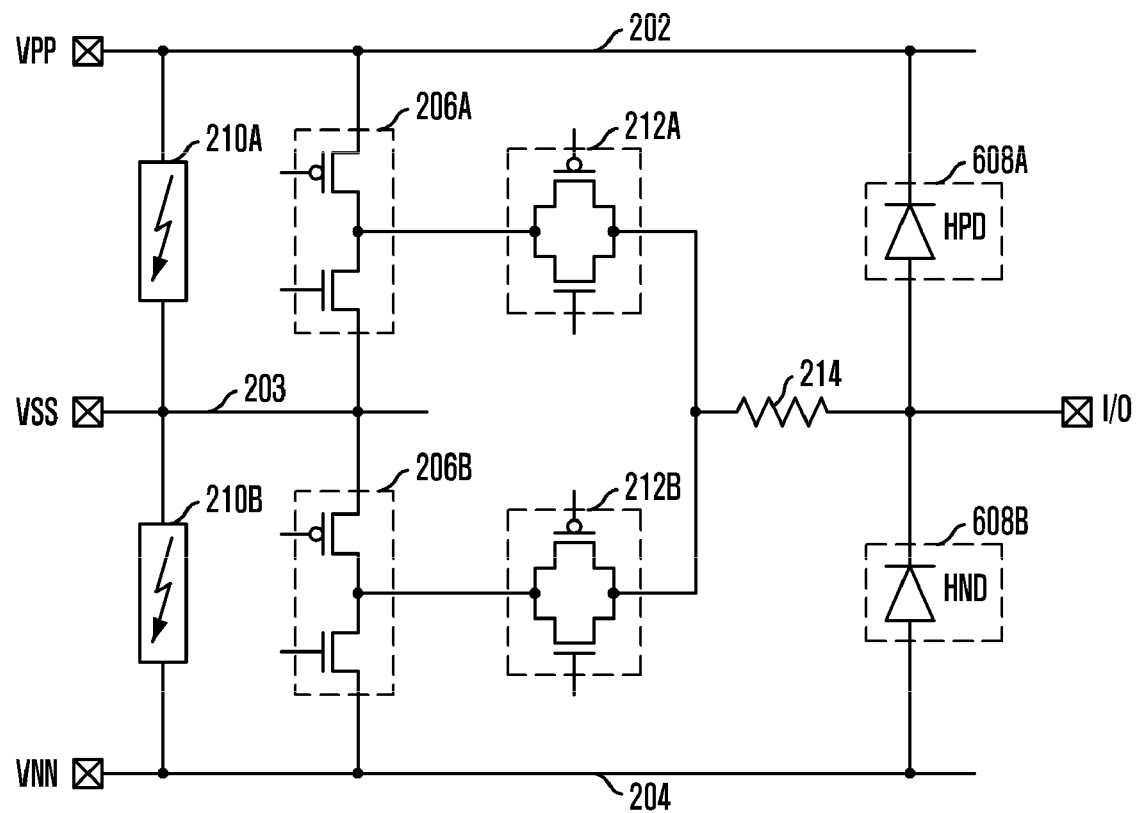
FIG. 6 is a circuit diagram of an ESD protection circuit in accordance with a fifth embodiment of the present invention.
Figure 10:
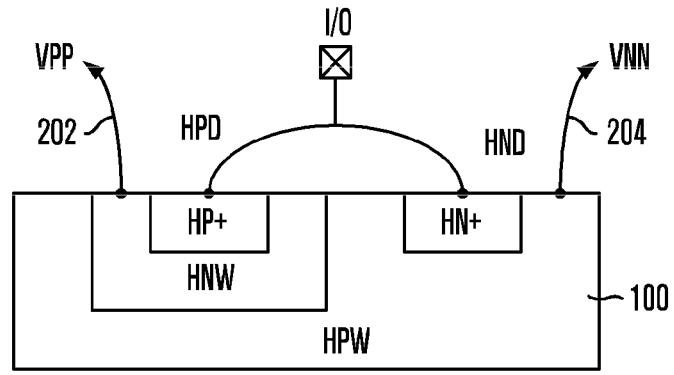
FIG. 10 is a cross-sectional view illustrating first and second transfer units shown in FIG. 6.

FIG. 6 is a circuit diagram of an ESD protection circuit in accordance with a fifth embodiment of the present invention. FIG. 10 is a cross-sectional view illustrating first and second transfer units 608A and 608B shown in FIG. 6.

Referring to FIG. 6, in the ESD protection circuit in accordance with the fifth embodiment of the present invention, each of the first and second transfer units 608A and 608B is implemented with one high voltage diode. That is, the first transfer unit 608A is configured with a high voltage diode HPD, and the second transfer unit 608B is configured with a high voltage diode HND.

In the ESP protection circuit in accordance with the fifth embodiment of FIG. 10, since the first and second transfer units 608A and 608B are implemented with the high voltage diodes HPD and HND, respectively, the high voltage diodes HPD and HND have breakdown voltages higher than the first and second operating voltages of the first and second output buffers 206A and 206B. Preferably, each of the high voltage diodes HPD and HND has the breakdown voltage of 30 V when the source operating voltage swings from −5 V to 5 V.

In accordance with the specific embodiments of the present invention, it is possible to safely protect internal circuits of a source driver of a drive integrated circuit in a liquid crystal display supporting a dot inversion scheme, which requires an operating voltage level ranging from a negative voltage level to a positive voltage level.

As described above, the technical idea of the present invention has been specifically described with respect to the preferred embodiments, but it should be noted that the foregoing embodiments are provided only for illustration while not limiting the present invention. In particular, although the description has been made on the ESD protection circuit provided to an output terminal (input/output pad) of a source driver in a drive IC hip of a liquid crystal display supporting a dot inversion scheme, the present invention can also be applied to devices requiring an operating voltage ranging from a negative voltage level to a positive voltage level. Thus, it can be understood by a person with ordinary skill in the art that various changes and modifications may be made without departing from the spirit and scope of the invention as defined in the following claims.

What is claimed is:

1. An electrostatic discharge (ESD) protection circuit, comprising:
    a first clamp connected between a first power line and a ground line;
    a second clamp connected between the ground line and a second power line;
    a first output buffer connected between the first power line and the ground line, and providing a first operating voltage to an input/output pad;
    a second output buffer connected between the ground line and the second power line, and providing a second operating voltage to the input/output pad;
    a first switch unit configured to transfer the first operating voltage to the input/output pad;
    a second switch unit configured to transfer the second operating voltage to the input/output pad;
    a first transfer unit comprising one or more diodes having a breakdown voltage higher than the first operating voltage and connected in series between the first power line and the input/output pad; and
    a second transfer unit comprising one or more diodes having a breakdown voltage higher than the second operating voltage and connected in series between the input/output pad and the second power line.

2. The ESD protection circuit of claim 1, wherein the first transfer unit has includes one diode, and the second transfer unit includes two diodes having a breakdown voltage lower than the diode of the first transfer unit.

3. The ESD protection circuit of claim 2, wherein the first and second transfer units comprise:
    an n-well formed in a substrate;
    a first p-well formed in the n-well;
    a first n-doped region formed in the first p-well;
    a second p-well formed in the n-well apart from the first p-well with a predetermined distance;
    a second n-doped region formed in the second p-well; and
    a p-doped region formed in the n-well.

4. The ESD protection circuit of claim 3, wherein the n-well is coupled to the first power line, the first p-well is coupled to the second power line, the first n-doped region is coupled to the second p-well, and both of the second n-doped region and the p-doped region are coupled to the input/output pad.

5. The ESD protection circuit of claim 1, wherein the first transfer unit has includes two diodes, and the second transfer unit includes one diode having a breakdown voltage higher than the diode of the first transfer unit.

6. The ESD protection circuit of claim 5, wherein the first and second transfer units comprise:
    a p-well formed in a substrate;
    a first n-well formed in the p-well;
    a first p-doped region formed in the first n-well;
    a second n-well formed in the p-well apart from the first n-well with a predetermined distance;
    a second p-doped region formed in the second n-well; and
    an n-doped region formed in the p-well.

7. The ESD protection circuit of claim 6, wherein the p-well is coupled to the second power line, the first n-well is coupled to the first power line, the first p-doped region is coupled to the second n-well, and both of the second p-doped region and the n-doped region are coupled to the input/output pad.

8. The ESD protection circuit of claim 1, wherein the diode of first transfer unit has a breakdown voltage equal to the diode of the second transfer unit.

9. The ESD protection circuit of claim 8, wherein the first and second transfer units comprise:
- a p-well formed in a substrate;
- an n-well formed in the p-well;
- a p-doped region formed in the n-well; and
- an n-doped region formed in the p-well apart from the n-well with a predetermined distance.

10. The ESD protection circuit of claim 9, wherein the p-well is coupled to the second power line, the n-well is coupled to the first power line, and both of the p-doped region and the n-doped region are coupled to the input/output pad.

11. The ESD protection circuit of claim 1, wherein the first power line outputs a voltage ranging between a positive power supply voltage and a ground voltage, and the second power line outputs a voltage ranging between a negative power supply voltage and the ground voltage.

12. The ESD protection circuit of claim 1, wherein each of the first and second first clamps maintains a voltage between the corresponding power line and the ground line to a predetermined voltage level.

* * * * *